US012609662B2

(12) United States Patent
Hanaoka

(10) Patent No.: US 12,609,662 B2
(45) Date of Patent: Apr. 21, 2026

(54) RADIO-FREQUENCY CIRCUIT AND COMMUNICATION DEVICE

(71) Applicant: Murata Manufacturing Co., Ltd., Nagaokakyo (JP)

(72) Inventor: Kunitoshi Hanaoka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 664 days.

(21) Appl. No.: 18/057,339

(22) Filed: Nov. 21, 2022

(65) Prior Publication Data

US 2023/0092914 A1 Mar. 23, 2023

Related U.S. Application Data

(63) Continuation of application No. PCT/JP2021/020865, filed on Jun. 1, 2021.

(30) Foreign Application Priority Data

Jun. 23, 2020 (JP) ................................. 2020-108084

(51) Int. Cl.
*H04B 1/40* (2015.01)
*H03F 1/02* (2006.01)
*H03F 3/24* (2006.01)

(52) U.S. Cl.
CPC ........... *H03F 3/245* (2013.01); *H03F 1/0233* (2013.01); *H04B 1/40* (2013.01); *H03F 2200/105* (2013.01); *H03F 2200/451* (2013.01)

(58) Field of Classification Search
CPC . H03F 3/245; H03F 3/195; H03F 3/72; H03F 1/0233; H03F 1/0216; H03F 2200/105; H03F 2200/451; H03F 2200/102; H03F 2203/7227; H04B 1/40; H04B 1/00; H04B 1/38

(Continued)

(56) References Cited

U.S. PATENT DOCUMENTS 8,884,696 B2 11/2014 Langer
2012/0146731 A1 6/2012 Khesbak
(Continued)

FOREIGN PATENT DOCUMENTS

CN 103731107 A 4/2014
JP 2008148098 A 6/2008
(Continued)

OTHER PUBLICATIONS

International Search Report in PCT/JP2021/020865, mailed Aug. 3, 2021, 3 pages.

*Primary Examiner* — Andrea Lindgren Baltzell
*Assistant Examiner* — Nareh Shamiryan
(74) *Attorney, Agent, or Firm* — ArentFox Schiff LLP

(57) ABSTRACT

A radio-frequency circuit is provided that includes a power amplifier, a control circuit, an on-off switch, a connection terminal, and a mount board. The power amplifier supports an APT system and an ET system. The control circuit controls the power amplifier by using the APT system and the ET system. The on-off switch is connected in series to a capacitive element connected between a path and the ground. The connection terminal is connected to the capacitive element. Moreover, the control circuit overlies the connection terminal in plan view in the thickness direction of the mount board.

18 Claims, 8 Drawing Sheets

(58) Field of Classification Search
USPC .......................................................... 330/297
See application file for complete search history.

(56) References Cited

U.S. PATENT DOCUMENTS

| | | | | |
|---|---|---|---|---|
| 2012/0154035 | A1* | 6/2012 | Hongo ................. | H04B 1/0483 |
| | | | | 330/127 |
| 2012/0294201 | A1 | 11/2012 | Kurokawa et al. | |
| 2014/0103995 | A1 | 4/2014 | Langer | |
| 2015/0200189 | A1 | 7/2015 | Teeter et al. | |
| 2015/0303971 | A1* | 10/2015 | Reisner .................... | H04B 1/40 |
| | | | | 330/307 |
| 2016/0036388 | A1 | 2/2016 | Xu et al. | |
| 2018/0159486 | A1* | 6/2018 | Ranta ......................... | H03F 1/56 |
| 2018/0294783 | A1* | 10/2018 | Okabe ..................... | H03F 3/245 |
| 2018/0302047 | A1 | 10/2018 | Igarashi et al. | |
| 2020/0169232 | A1 | 5/2020 | Goto et al. | |

FOREIGN PATENT DOCUMENTS

| | | | |
|---|---|---|---|
| JP | 2011176529 | A | 9/2011 |
| JP | 2012134705 | A | 7/2012 |
| JP | 2014502808 | A | 2/2014 |
| JP | 2018182720 | A | 11/2018 |

* cited by examiner

RADIO-FREQUENCY CIRCUIT AND COMMUNICATION DEVICE

CROSS REFERENCE TO RELATED APPLICATIONS

This application is a continuation of PCT Application No. PCT/JP2021/020865, filed Jun. 1, 2021, which claims priority to Japanese Patent Application No. 2020-108084, filed Jun. 23, 2020, the entire contents of each of which are hereby incorporated by reference in their entirety.

TECHNICAL FIELD

The present invention generally relates to a radio-frequency circuit and a communication device, and, more particularly, to a radio-frequency circuit including a power amplifier, and a communication device including the radio-frequency circuit.

Japanese Patent Application Publication No. 2014-502808 (hereinafter "Patent Document 1" describes a power amplifier system (e.g., a radio-frequency circuit) including an envelope tracker, first to third power amplifiers, and first to third switched capacitors. In the power amplifier system described in Patent Document 1, one of the first to third power amplifiers is enabled, and the remaining two amplifiers are disabled. Thus, the capacitive load on the envelope tracker may be reduced, and the efficiency of the power amplifier system may be improved.

When the power amplifier system as described in Patent Document 1 supports the average power tracking system and the envelope tracking system, the power supply voltage supplied to the power amplifiers may be unstable in the average power tracking system.

SUMMARY OF THE INVENTION

Accordingly, it is an object of the present invention to provide a radio-frequency circuit and a communication device that enable the power supply voltage, which is supplied to a power amplifier, to be stabilized in the average power tracking system when the average power tracking system and the envelope tracking system are supported.

In an exemplary aspect, a radio-frequency circuit is provided that includes a power amplifier, a control circuit, an on-off switch, a connection terminal, and a mount board. The power amplifier, which has a power supply terminal, support the average power tracking system and the envelope tracking system. The control circuit, which is connected to the power supply terminal, controls the power amplifier by using the average power tracking system and the envelope tracking system. The on-off switch is connected in series to a capacitive element connected between the ground and the path between the control circuit and the power supply terminal. Moreover, the connection terminal is connected to the capacitive element. The mount board has first and second principal surfaces that oppose each other. The control circuit overlies the connection terminal in a plan view in the thickness direction of the mount board.

In another exemplary aspect, a communication device is provided that includes the radio-frequency circuit and a signal processing circuit. The signal processing circuit, which is connected to the radio-frequency circuit, processes a radio-frequency signal.

The radio-frequency circuit and the communication device according to the exemplary aspects of the present invention enable the power supply voltage, which is supplied to the power amplifier, to be stabilized in the average power tracking system when the average power tracking system and the envelope tracking system are supported.

DETAILED DESCRIPTION OF EMBODIMENTS

Figure 1:
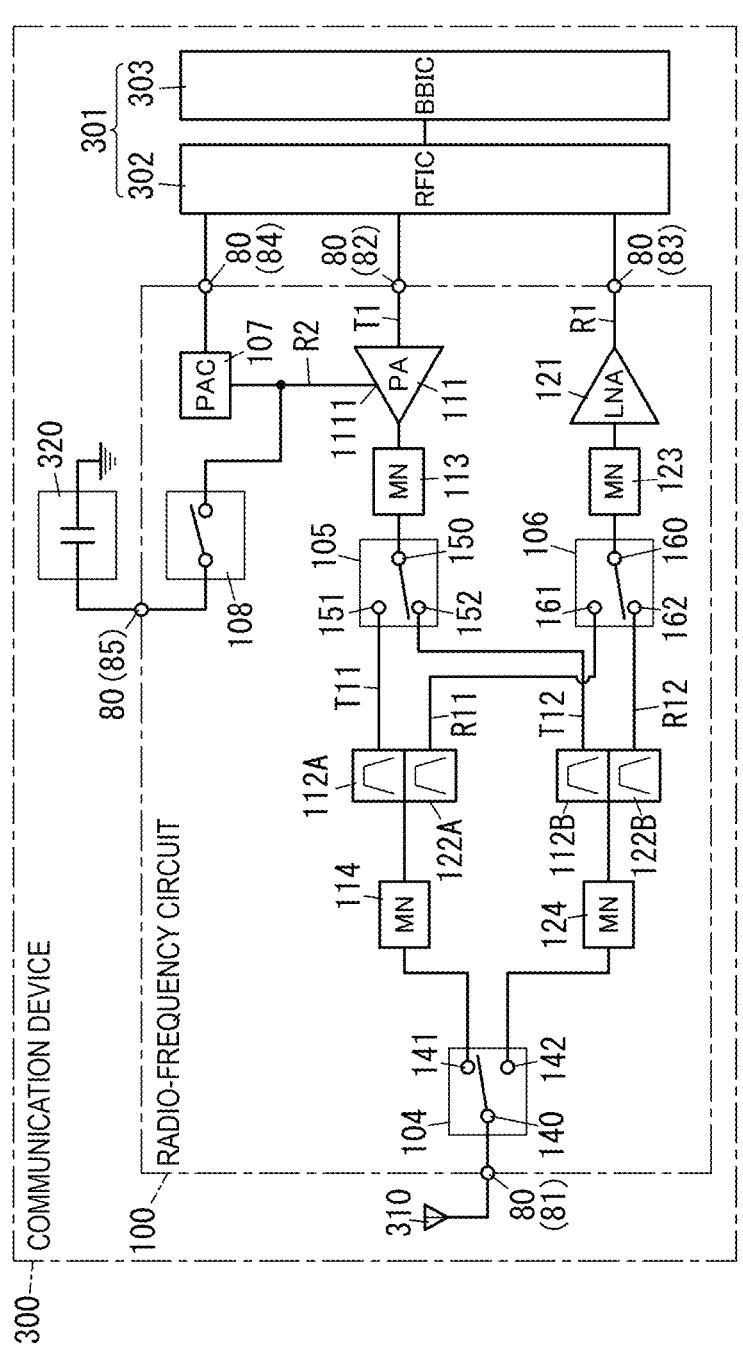
FIG. 1 is a diagram illustrating the circuit configuration of a radio-frequency circuit and a communication device according to a first exemplary embodiment.

FIGS. 2 to 6 and 8, which are referred to, for example, in first and second exemplary embodiments described below, are schematic diagrams. It is noted that the ratios of the sizes and the thicknesses of the components in the figures do not necessarily reflect the actual dimensional ratios.

In the present disclosure, the phrase "any component is disposed on the first principal surface side of a mount board" refers to the state in which, on the mount board having a first principal surface and a second principal surface which are opposite each other, the component is disposed closer to the first principal surface than the second principal surface of the mount board. Examples of the state, "any component is disposed on the first principal surface side of a mount board" include the case in which the component is disposed on the first principal surface of the mount board and the case in which the component is disposed so as to be spaced apart from the first principal surface of the mount board. Moreover, examples of the case in which "the component is disposed on the first principal surface of the mount board" include the case in which the component is mounted on the first principal surface of the mount board and the case in which a portion of the component is mounted on the first principal surface of the mount board and the remaining portion of the component is embedded in the mount board. An example of the case in which "the component is disposed so as to be spaced apart from the first principal surface of the mount board" is the case in which the component and a different component are stacked one on top of the other. In this case, the different component is mounted on the first principal surface of the mount board, and the component is laminated on the different component. Another different component may be present between the component and the different component.

Similarly, in the present disclosure, the phrase "any component is disposed on the second principal surface side of a mount board" refers to the state in which, on the mount board having a first principal surface and a second principal surface which are opposite each other, the component is disposed closer to the second principal surface than the first principal surface of the mount board. Examples of the state, "any component is disposed on the second principal surface side of a mount board," includes the case in which the component is disposed on the second principal surface of the mount board and the case in which the component is disposed so as to be spaced apart from the second principal surface of the mount board. Moreover, examples of the case in which "the component is disposed on the second principal surface of the mount board" include the case in which the component is mounted on the second principal surface of the mount board and the case in which a portion of the component is mounted on the second principal surface of the mount board and the remaining portion of the component is embedded in the mount board. An example of the case in which "the component is disposed so as to be spaced apart from the second principal surface of the mount board" is the case in which the component and a different component are stacked one on top of the other. In this case, the different component is mounted on the second principal surface of the mount board, and the component is laminated on the different component. Another different component may be present between the component and the different component.

First Exemplary Embodiment

Figure 2:
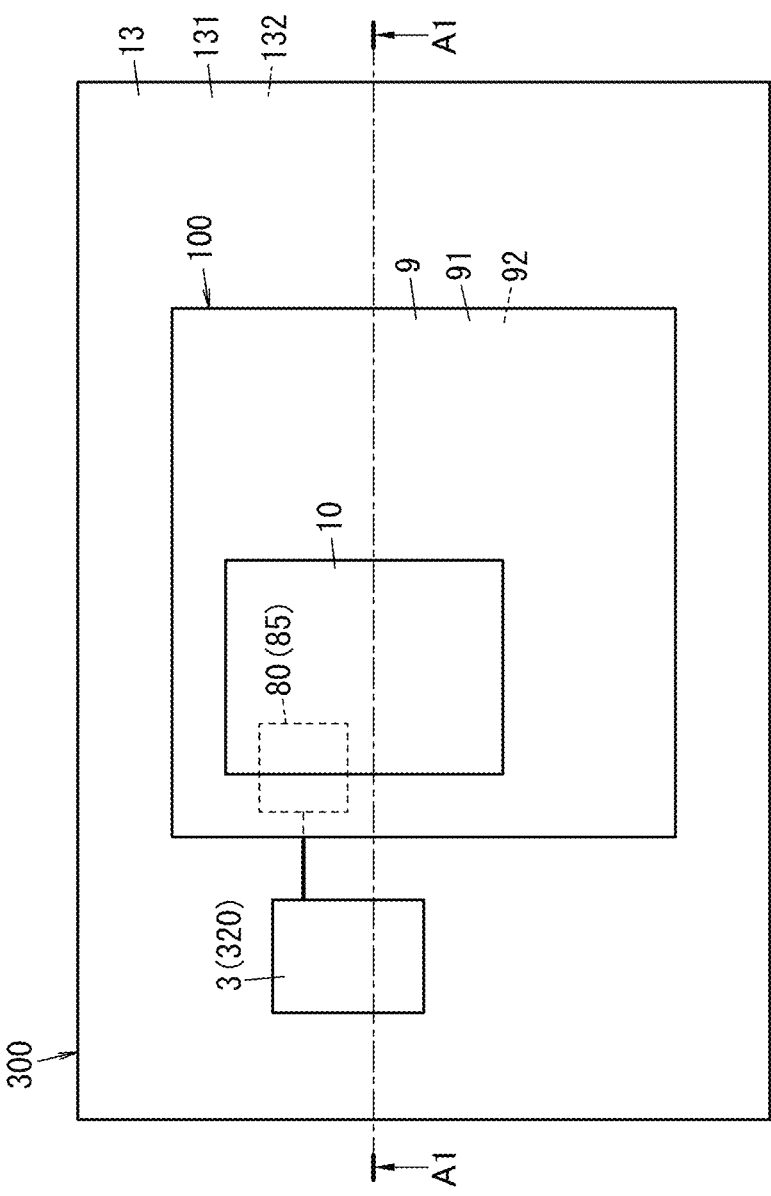
FIG. 2 is a plan view of the radio-frequency circuit.

As illustrated in FIG. 1, a radio-frequency circuit 100 according to the first embodiment includes a power amplifier 111, a controller (e.g., a control circuit) 107, an on-off switch 108, a connection terminal 85, and a mount board 9 (see FIG. 2). The power amplifier 111, which has a power supply terminal 1111, is configured to support the average power tracking system (hereinafter also referred to as the "APT system") and the envelope tracking system (hereinafter also referred to as the "ET system"). The controller 107, which is connected to the power supply terminal 1111, controls the power amplifier 111 by using the average power tracking system and the envelope tracking system. The on-off switch 108 is connected in series to a capacitive element 320 connected between the ground and a path R2 between the controller 107 and the power supply terminal 1111. For purposes of this disclosure, the phrase "the capacitive element is connected between the ground and the path between the controller and the power supply terminal" refers to the state in which the capacitive element is electrically connected, between the path and the ground, to both the ground and the path. Moreover, the connection terminal 85 is connected to the capacitive element 320. The mount board 9 has a first principal surface 91 and a second principal surface which are opposite each other. In plan view in the thickness direction D1 (see, e.g., FIG. 3) of the mount board 9, the control circuit 107 overlies the connection terminal 85. Thus, when both the average power tracking system and the envelope tracking system are supported, the radio-frequency circuit 100 according to the first embodiment configures the power supply voltage, which is supplied to the power amplifier 111, to be stabilized in the average power tracking system. In addition, a design can be made in which the wiring length between the control circuit 107 and the connection terminal 85 is short.

The radio-frequency circuit 100 and a communication device 300 according to the first embodiment will be described below by referring to FIGS. 1 to 6.

The Radio-Frequency Circuit and the Communication Device

The Circuit Configuration of the Radio-Frequency Circuit and the Communication Device The circuit configuration of the radio-frequency circuit 100 and the communication device 300 according to the first embodiment will be described by referring to FIG. 1.

In an exemplary aspect, the radio-frequency circuit 100 according to the first embodiment can be used in the communication device 300. The communication device 300 is, for example, a cellular phone (for example, a smartphone). However, the communication device 300 is not limited to this, and may be, for example, a wearable terminal (for example, a smartwatch) or the like. The radio-frequency circuit 100 is a module supporting, for example, a 4G (fourth-generation mobile communication) standard or a 5G (fifth generation mobile communication) standard. The 4G standard is, for example, the 3GPP LTE (Long Term Evolution) standard. The 5G standard is, for example, 5G NR (New Radio). The radio-frequency circuit 100 is a module configured for supporting carrier aggregation and dual connectivity.

The radio-frequency circuit 100 is configured to amplify, for example, transmit signals (e.g., radio-frequency signals), which are received from a signal processing circuit 301, for output to an antenna 310. In addition, the radio-frequency circuit 100 is configured for amplifying receive signals (e.g., radio-frequency signals), which are received from the antenna 310, for output to the signal processing circuit 301. The signal processing circuit 301 is, not a component of the radio-frequency circuit 100, a component of the communication device 300 including the radio-frequency circuit 100. The radio-frequency circuit 100 is controlled, for example, by the signal processing circuit 301 included in the communication device 300. Moreover, the communication device 300 includes the radio-frequency circuit 100 and the signal processing circuit 301. The communication device 300 further includes the antenna 310 and the capacitive element 320 and a circuit board 13 on which the radio-frequency circuit 100 is mounted.

As further shown, the capacitive element 320 is connected between the ground and the connection terminal 85 included in the radio-frequency circuit 100. The capacitive element 320 is formed, for example, of a single capacitor, and may include multiple capacitors. In this case, the multiple capacitors may be connected in series to each other, or may be connected in parallel to each other. Alternatively, a combination of these connection configurations may be employed.

The circuit board 13 is, for example, a printed wiring board and has a ground electrode to which a ground potential is provided. The circuit board 13 has a first principal surface 131 and a second principal surface 132 which are opposite each other in the thickness direction (e.g., the thickness direction D1 of the mount board 9 described below) of the circuit board 13 (see FIG. 3). In the communication device 300, the radio-frequency circuit 100 is disposed on the first principal surface 131 side of the circuit board 13. In the communication device 300, the capacitive element 320 is disposed on the first principal surface 131 side of the circuit board 13. In the communication device 300, the radio-frequency circuit 100 and the capacitive element 320 are adjacent to each other on the first principal surface 131 of the circuit board 13. For purposes of this disclosure, the phrase "two components are adjacent to each other" refers to the state in which no other components are present between the two adjacent components (i.e., they are directly connected). Therefore, in FIG. 3, no other components are present between the radio-frequency circuit 100 and the capacitive element 320. Thus, the radio-frequency circuit 100 and the capacitive element 320 are adjacent to each other on the first principal surface 131 of the circuit board 13, enabling the wiring length between the radio-frequency circuit 100 and the capacitive element 320 to be made short.

The signal processing circuit 301 includes, for example, an RF signal processing circuit 302 and a baseband signal processing circuit 303. The RF signal processing circuit 302, which is, for example an RFIC (Radio Frequency Integrated Circuit), performs signal processing on radio-frequency signals. For example, the RF signal processing circuit 302 performs signal processing such as upconverting on radio-frequency signals (e.g., transmit signals) which are output from the baseband signal processing circuit 303, and outputs the radio-frequency signals having been subjected to the signal processing. For example, the RF signal processing circuit 302 performs signal processing such as down-converting on radio-frequency signals (e.g., receive signals) which are output from the radio-frequency circuit 100, and outputs the radio-frequency signals, having been subjected to the signal processing, to the baseband signal processing circuit 303. The baseband signal processing circuit 303 is, for example, a BBIC (Baseband Integrated Circuit). In this aspect, the baseband signal processing circuit 303 generates an I-phase signal and a Q-phase signal from a baseband signal. A baseband signal is, for example, an audio signal or an image signal which is input from the outside. The baseband signal processing circuit 303 combines the I-phase signal and the Q-phase signal to perform an IQ modulation process, and outputs the transmit signal. At that time, the transmit signal is generated as a modulated signal (e.g., an IQ signal) obtained by performing amplitude modulation on a carrier signal, having a predetermined frequency, by using a period longer than that of the carrier signal. A receive signal processed by the baseband signal processing circuit 303 is used, for example, as an image signal for image display or as an audio signal for a phone conversation. The radio-frequency circuit 100 transmits radio-frequency signals (e.g., receive signals, transmit signals) between the antenna 310 and the RF signal processing circuit 302 of the signal processing circuit 301.

The radio-frequency circuit 100 includes the power amplifier 111 and a low-noise amplifier 121. The radio-frequency circuit 100 also includes multiple (e.g., two) transmit filters 112A and 112B and multiple (e.g., two) receive filters 122A and 122B. The radio-frequency circuit 100 also includes an output matching circuit 113, an input matching circuit 123, and multiple (e.g., two) matching circuits 114 and 124. The radio-frequency circuit 100 also includes a first switch 104, a second switch 105, and a third switch 106. The radio-frequency circuit 100 includes the controller (e.g., a control circuit) 107 and the on-off switch 108.

The radio-frequency circuit 100 also includes multiple external connection terminals 80. The external connection terminals 80 include an antenna terminal 81, a signal input terminal 82, a signal output terminal 83, a control terminal 84, the connection terminal 85, and multiple ground terminals 86 (see FIG. 5). The ground terminals 86 are terminals that are electrically connected to the ground electrode of the circuit board 13 included in the communication device 300 and to which the ground potential is provided.

As further shown, the power amplifier 111 is disposed on a signal path T1 for transmit signals. The power amplifier 111 has an input terminal, an output terminal, and the power supply terminal 1111. The power amplifier 111 amplifies transmit signals in a first frequency band, which are received at the input terminal, for output from the output terminal. The first frequency band includes, for example, a first communication band and a second communication band.

The first communication band, which corresponds to transmit signals passing through the transmit filter 112A, is, for example, Band11 of the 3GPP LTE standard. The second communication band, which corresponds to transmit signals passing through the transmit filter 112B, is, for example, Band22 of the 3GPP LTE standard.

The power amplifier 111 is connected, at the input terminal, to the signal input terminal 82. The power amplifier 111 is connected, at the input terminal, to the signal processing circuit 301 through the signal input terminal 82. The signal input terminal 82 is a terminal for inputting, to the radio-frequency circuit 100, radio-frequency signals (e.g., transmit signals) from an external circuit (for example, the signal processing circuit 301). The power amplifier 111 is connected, at the output terminal, to a common terminal 150 of the second switch 105 through the output matching circuit 113. The power amplifier 111 is connected, at the power supply terminal 1111, to the controller 107. The power amplifier 111 is controlled, for example, by the controller (e.g., the control circuit) 107.

Moreover, the low-noise amplifier 121 is disposed on a signal path R1 for receive signals. The low-noise amplifier 121 has an input terminal and an output terminal. The low-noise amplifier 121 amplifies receive signals in a second frequency band, which are received at the input terminal, for output from the output terminal. For example, the second frequency band, which is the same as the first frequency band, has the first communication band and the second communication band.

The low-noise amplifier 121 is connected, at the input terminal, to a common terminal 160 of the third switch 106 through the input matching circuit 123. The low-noise amplifier 121 is connected, at the output terminal, to the signal output terminal 83. The low-noise amplifier 121 is connected, at the output terminal, for example, to the signal processing circuit 301 through the signal output terminal 83. The signal output terminal 83 is a terminal for outputting, to an external circuit (for example, the signal processing circuit 301), radio-frequency signals (e.g., receive signals) from low-noise amplifier 121.

The transmit filter 112A is a filter, for example, whose passband matches the transmit band of the first communication band. The transmit filter 112B is a filter, for example, whose passband matches the transmit band of the second communication band. The receive filter 122A is a filter, for example, whose passband matches the receive band of the first communication band. The receive filter 122B is a filter, for example, whose passband matches the receive band of the second communication band. In the radio-frequency circuit 100 according to the first embodiment, the transmit filter 112A and the receive filter 122A form a first duplexer, and the transmit filter 112B and the receive filter 122B form a second duplexer.

The first switch 104 has a common terminal 140 and multiple (e.g., two) selection terminals 141 and 142. The common terminal 140 is connected to the antenna terminal 81. The antenna terminal 81 is connected to the antenna 310. The selection terminal 141 is connected to the output terminal of the transmit filter 112A and the input terminal of the receive filter 122A. The selection terminal 142 is connected to the output terminal of the transmit filter 112B and the input terminal of the receive filter 122B. The first switch 104 is, for example, a switch configured to connect either one or both of the selection terminals 141 and 142 to the common terminal 140. The first switch 104 is, for example, a switch that enables one-to-one connection and one-to-many connection.

The first switch 104 is disposed on both the signal path T1 (T11, T12) for transmit signals and the signal path R1 (R11, R12) for receive signals. More specifically, the first switch 104 is disposed on the signal path T11 for transmit signals, on which the power amplifier 111, the output matching circuit 113, the second switch 105, the transmit filter 112A, and the matching circuit 114 are disposed. The first switch 104 is also disposed on the signal path T12 for transmit signals, on which the power amplifier 111, the output matching circuit 113, the second switch 105, the transmit filter 112B, and the matching circuit 124 are disposed. The first switch 104 is also disposed on the signal path R11 for receive signals, on which the matching circuit 114, the receive filter 122A, the third switch 106, the input matching circuit 123, and the low-noise amplifier 121 are disposed. The first switch 104 is also disposed on the signal path R12 for receive signals, on which the matching circuit 124, the receive filter 122B, the third switch 106, the input matching circuit 123, and the low-noise amplifier 121 are disposed.

In the exemplary aspect, the first switch 104 is controlled, for example, by the signal processing circuit 301. The first switch 104 switches the connection state between the common terminal 140 and the selection terminals 141 and 142 in accordance with a control signal from the RF signal processing circuit 302 of the signal processing circuit 301. The first switch 104 is, for example, a switch IC (Integrated Circuit).

The second switch 105 has the common terminal 150 and multiple (e.g., two) selection terminals 151 and 152. The common terminal 150 is connected to the output terminal of the power amplifier 111 through the output matching circuit 113. The selection terminal 151 is connected to the input terminal of the transmit filter 112A. The selection terminal 152 is connected to the input terminal of the transmit filter 112B. The second switch 105 is, for example, a switch that is configured to connect either one or both of the selection terminals 151 and 152 to the common terminal 150. The second switch 105 is, for example, a switch that configures a one-to-one connection and a one-to-many connection. The second switch 105 is a switch which has a function of switching between the signal paths T11 and T12, for transmit signals, whose communication bands are different from each other.

The second switch 105 is controlled, for example, by the signal processing circuit 301. The second switch 105 switches the connection state between the common terminal 150 and the selection terminals 151 and 152 in accordance with a control signal from the RF signal processing circuit 302 of the signal processing circuit 301. The second switch 105 is, for example, a switch IC.

The third switch 106 has the common terminal 160 and multiple (e.g., two) selection terminals 161 and 162. The common terminal 160 is connected to the input terminal of the low-noise amplifier 121 through the input matching circuit 123. The selection terminal 161 is connected to the output terminal of the receive filter 122A. The selection terminal 162 is connected to the output terminal of the receive filter 122B. The third switch 106 is, for example, a switch that is configured to connect either one or both of the selection terminals 161 and 162 to the common terminal 160. The third switch 106 is, for example, a switch that configures a one-to-one connection or a one-to-many connection. The third switch 106 is a switch which has a function of switching between the signal paths R11 and R12, for receive signals, whose communication bands are different from each other.

The third switch 106 is controlled, for example, by the signal processing circuit 301. The third switch 106 switches the connection state between the common terminal 160 and the selection terminals 161 and 162 in accordance with a control signal from the RF signal processing circuit 302 of the signal processing circuit 301. The third switch 106 is, for example, a switch IC.

The output matching circuit 113 is disposed on the signal path between the output terminal of the power amplifier 111 and the common terminal 150 of the second switch 105. The output matching circuit 113 is a circuit for matching the impedance between the power amplifier 111 and the transmit filters 112A and 112B. The output matching circuit 113 is formed, for example, of a single inductor. However, the configuration is not limited to this. For example, the output matching circuit 113 can include multiple inductors and multiple capacitors in alternative aspects.

The input matching circuit 123 is disposed on the signal path between the input terminal of the low-noise amplifier 121 and the common terminal 160 of the third switch 106. The input matching circuit 123 is a circuit for matching the impedance between the low-noise amplifier 121 and the receive filters 122A and 122B. The input matching circuit 123 is formed, for example, of a single inductor. However, the configuration is not limited to this. For example, the input matching circuit 123 can include multiple inductors and multiple capacitors in alternative aspects.

The matching circuit 114 is disposed on the signal path between the selection terminal 141 of the first switch 104, and the output terminal of the transmit filter 112A and the input terminal of the receive filter 122A. The matching circuit 114 is a circuit for matching the impedance between the first switch 104, and the transmit filter 112A and the receive filter 122A. The matching circuit 114 is formed, for example, of a single inductor in this aspect. However, the configuration is not limited to this. For example, the matching circuit 114 can include multiple inductors and multiple capacitors in alternative aspects.

The matching circuit 124 is disposed on the signal path between the selection terminal 142 of the first switch 104, and the output terminal of the transmit filter 112B and the input terminal of the receive filter 122B. The matching circuit 124 is a circuit for matching the impedance between the first switch 104, and the transmit filter 112B and the receive filter 122B. The matching circuit 124 is formed, for example, of a single inductor in this aspect. However, the configuration is not limited to this. For example, the matching circuit 124 include multiple inductors and multiple capacitors in alternative aspects.

The controller 107 is connected to the power amplifier 111. The controller 107 is connected, for example, to the signal processing circuit 301 through the control terminal 84. The control terminal 84 is a terminal for inputting, to the controller 107, a control signal from an external circuit (for example, the signal processing circuit 301). The controller 107 controls the power amplifier 111 on the basis of the control signal obtained from the control terminal 84. The controller 107 controls the power amplifier 111 in accordance with the control signal from the RF signal processing circuit 302 of the signal processing circuit 301. In this control, the controller 107 obtains the control signal from the RF signal processing circuit 302, and operates the power amplifier 111, for example, in a first power mode or a second power mode on the basis of the control signal. When the control signal from the RF signal processing circuit 302 is a signal indicating an instruction to operate the power amplifier 111 in the first power mode, the controller 107 operates the power amplifier 111 in the first power mode. When the control signal from the RF signal processing circuit 302 is a signal indicating an instruction to operate the power amplifier 111 in the second power mode, the controller 107 operates the power amplifier 111 in the second power mode.

In the first power mode, the controller 107 causes the power amplifier 111 to perform an envelope tracking operation. That is, in the first power mode, the controller 107 controls the power amplifier 111 by using the envelope tracking system. In this case, the controller 107 controls the power supply voltage of the power amplifier 111 in accordance with the input signal level of a transmit signal (e.g., a transmit signal from the signal processing circuit 301) received by the power amplifier 111. More specifically, in the radio-frequency circuit 100, the power supply terminal 1111 of the power amplifier 111 is supplied with a power supply voltage in accordance with the amplitude level of the transmit signal. For example, the controller 107 generates a power supply voltage on the basis of a power-supply control signal (e.g., an envelope signal) from the baseband signal processing circuit 303 of the signal processing circuit 301, and supplies the generated power supply voltage to the power supply terminal 1111 of the power amplifier 111. The baseband signal processing circuit 303 detects the amplitude level of a modulated signal on the basis of IQ signals, and outputs the power-supply control signal to the controller 107 so that the power supply voltage has a level corresponding to the amplitude level of the transmit signal.

In the second power mode, the controller 107 causes the power amplifier 111 to perform an average power tracking operation. That is, in the second power mode, the controller 107 controls the power amplifier 111 by using the average power tracking system. In this case, the controller 107 calculates the average power amplitude of a radio-frequency signal for each predetermined period on the basis of a power-supply control signal from the baseband signal processing circuit 303, and controls the power supply voltage of the power amplifier 111 in accordance with the calculated average power amplitude.

The on-off switch 108 is connected between the path R2 and the connection terminal 85. The path R2 is a path between the power supply terminal 1111 of the power amplifier 111 and the controller 107. The on-off switch 108 is controlled, for example, by the controller 107. In the first power mode, the on-off switch 108 is switched off in accordance with a control signal from the controller 107 so that the capacitive element 320 connected to the connection terminal 85 is not connected to the path R2. In other words, when the controller 107 controls the power amplifier 111 by using the envelope tracking system, the controller 107 switches off the on-off switch 108. In the second power mode, the on-off switch 108 is switched on in accordance with the control signal from the controller 107 so that the capacitive element 320 is connected to the path R2. In other words, when the controller 107 controls the power amplifier 111 by using the average power tracking system, the controller 107 switches on the on-off switch 108.

The Structure of the Radio-Frequency Module

Figure 3:
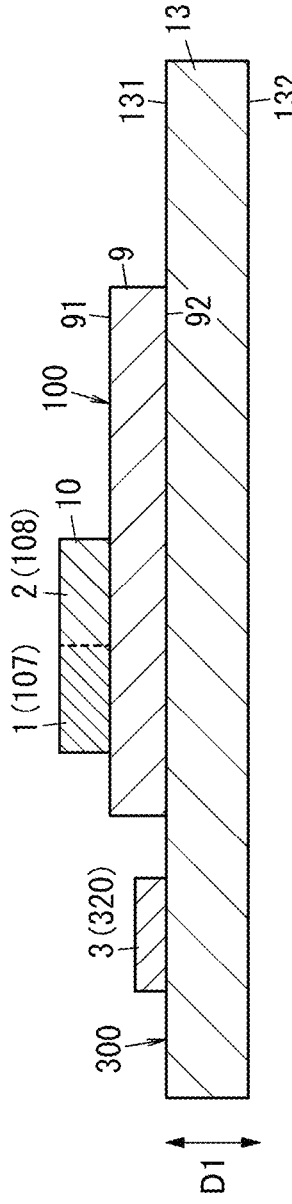
FIG. 3 is a cross-sectional view along A1-A1 in FIG. 2.

As illustrated in FIGS. 2 and 3, the radio-frequency circuit 100 according to the first embodiment further includes the mount board 9. Hereinafter, the radio-frequency circuit 100 including the mount board 9 may be referred to as the "radio-frequency module 100" for purposes of this disclosure. The structure of the radio-frequency module 100 according to the first embodiment will be described by referring to FIGS. 2 and 3.

As illustrated in FIGS. 2 and 3, the radio-frequency module 100 includes the mount board 9, a first electronic component 1, a second electronic component 2, and the external connection terminals 80 (see FIG. 1). The first electronic component 1 is, for example, the controller 107. The second electronic component 2 is, for example, the on-off switch 108. In the radio-frequency module 100 according to the first embodiment, the controller 107 and the on-off switch 108 are formed in a single chip 10. That is, the chip 10 includes the controller 107 and the on-off switch 108.

As shown, the mount board 9 has the first principal surface 91 and the second principal surface 92 that are opposite each other in the thickness direction D1 of the mount board 9. The mount board 9 is, for example, a multilayer substrate including multiple dielectric layers and multiple conductive layers. The dielectric layers and the conductive layers are laminated in the thickness direction D1 of the mount board 9 in the exemplary aspect. The conductive layers are formed in predetermined patterns defined for the respective layers. Each of the conductive layers includes one or more conductive portions in a plane orthogonal to the thickness direction D1 of the mount board 9. The material of the conductive layers is, for example, copper. The conductive layers include a ground layer. In the radio-frequency module 100, the ground terminals 86 are electrically connected to the ground layer, for example, through via conductors included in the mount board 9. The mount board 9 is, for example, an LTCC (Low Temperature Co-fired Ceramics) substrate. The mount board 9 is not limited to an LTCC substrate, and, for example, may be a printed wiring board, an HTCC (High Temperature Co-fired Ceramics) substrate, or a multilayer resin substrate.

It is noted that the mount board 9 is not limited to an LTCC substrate, and, for example, may be a wiring structure, which is, for example, a multilayer structure. The multilayer structure includes at least one insulating layer and at least one conductive layer. The insulating layer is formed in a predetermined pattern. In the case of multiple insulating layers, the insulating layers are formed in predetermined patterns defined for the respective layers. The conductive layer is formed in a predetermined pattern different from the predetermined pattern of the insulating layer. In the case of multiple conductive layers, the conductive layers are formed in predetermined patterns defined for the respective layers. The conductive layer may include one or more redistribution portions. In the wiring structure, among two surfaces opposite each other in the thickness direction of the multilayer structure, a first surface is the first principal surface 91 of the mount board 9; a second surface is the second principal surface 92 of the mount board 9. The wiring structure may be, for example, an interposer. The interposer may be an interposer formed by using a silicon substrate, or may be a substrate including multiple layers.

The first principal surface 91 and the second principal surface 92 of the mount board 9 are spaced apart from each other in the thickness direction D1 of the mount board 9, and cross the thickness direction D1 of the mount board 9. The first principal surface 91 of the mount board 9 is orthogonal, for example, to the thickness direction D1 of the mount board 9. Alternatively, for example, the first principal surface 91 may include a side surface or the like of a conductive portion as a surface which is not orthogonal to the thickness direction D1. The second principal surface 92 of the mount board 9 is orthogonal, for example, to the thickness direction D1 of the mount board 9. Alternatively, for example, the second principal surface 92 may include a side surface or the like of a conductive portion as a surface which is not orthogonal to the thickness direction D1. The first principal surface 91 and the second principal surface 92 of the mount board 9 may have minute unevenness, a recess portion, or a protrusion portion formed thereon. In plan view in the thickness direction D1 of the mount board 9, the mount board 9 is rectangular. However, the configuration is not limited to this. For example, the mount board 9 may be square in an alternative aspect. In the radio-frequency module 100 according to the first embodiment, the mount board 9 is a single-sided mount board having electronic components mounted only on the first principal surface 91.

The power amplifier 111 is, for example, an IC chip including a substrate having a first principal surface and a second principal surface that are opposite each other, and a circuit portion (e.g., an IC portion) having a transistor formed on the first principal surface side of the substrate. The substrate is, for example, a gallium arsenic substrate. The circuit portion has a function of amplifying transmit signals received at the input terminal of the power amplifier 111. The transistor is, for example, an HBT (Heterojunction Bipolar Transistor). The power amplifier 111 may include, for example, a capacitor for cutting direct current. For example, the IC chip including the power amplifier 111 is flip-chip packaged on the first principal surface 91 of the mount board 9 so that, among the first principal surface and the second principal surface of the substrate, the first principal surface is present on the first principal surface 91 side of the mount board 9. In plan view in the thickness direction D1 of the mount board 9, the outer shape of the IC chip including the power amplifier 111 is quadrate. It is noted that the substrate of the IC chip including the power amplifier 111 is not limited to a gallium arsenic substrate, and may be a silicon substrate, a silicon germanium substrate, a gallium nitride substrate, or the like. The transistor is not limited to a bipolar transistor such as an HBT, and may be, for example, a FET (Field Effect Transistor). The FET is, for example, a MOSFET (Metal-Oxide-Semiconductor Field Effect Transistor).

The low-noise amplifier 121 is, for example, an IC chip including a substrate having a first principal surface and a second principal surface which are opposite each other, and a circuit portion (e.g., an IC portion) formed on the first principal surface side of the substrate. The substrate is, for example, a silicon substrate. The circuit portion has a function of amplifying receive signals received at the input terminal of the low-noise amplifier 121. For example, the low-noise amplifier 121 is flip-chip packaged on the first principal surface 91 of the mount board 9 so that, among the first principal surface and the second principal surface of the substrate, the first principal surface is present on the first principal surface 91 side of the mount board 9. In plan view in the thickness direction D1 of the mount board 9, the outer shape of the low-noise amplifier 121 is quadrate.

Each of the transmit filters 112A and 112B and the receive filters 122A and 122B is, for example, a ladder filter. Each of the transmit filters 112A and 112B and the receive filters 122A and 122B has multiple (for example, four) serial arm resonators and multiple (for example, three) parallel arm resonators. Each of the transmit filters 112A and 112B and the receive filters 122A and 122B is, for example, an acoustic wave filter. The acoustic wave filter is formed of multiple serial arm resonators and multiple parallel arm resonators, each of which is an acoustic wave resonator. The acoustic wave filter is, for example, a surface acoustic wave filter using surface acoustic waves.

In the surface acoustic wave filter, each of the serial arm resonators and the parallel arm resonators is, for example, a SAW (Surface Acoustic Wave) resonator according to an exemplary aspect.

For example, the surface acoustic wave filter includes a substrate having a first principal surface and a second principal surface that are opposite each other, and a circuit portion formed on the first principal surface side of the substrate. The substrate is a piezoelectric substrate, which is, for example, a lithium niobate substrate. The circuit portion has multiple IDT (Interdigital Transducer) electrodes corresponding one-to-one to multiple serial arm resonators, and multiple IDT electrodes corresponding one-to-one to multiple parallel arm resonators.

Each of the transmit filters 112A and 112B and the receive filters 122A and 122B is, for example, a bare-chip acoustic wave filter. In plan view in the thickness direction D1 of the mount board 9, the outer shape of each of the transmit filters 112A and 112B and the receive filters 122A and 122B is quadrate. For example, each of the transmit filters 112A and 112B and the receive filters 122A and 122B is flip-chip packaged on the first principal surface 91 of the mount board 9 so that, among the first principal surface and the second principal surface of the corresponding substrate, the first principal surface is present on the mount board 9 side.

Each of the first switch 104, the second switch 105, and the third switch 106 is a switch IC. More specifically, each of the first switch 104, the second switch 105, and the third switch 106 is, for example, an IC chip including a substrate having a first principal surface and a second principal surface which are opposite each other, and a circuit portion (e.g., an IC portion) having a FET formed on the first principal surface side of the substrate. The substrate is, for example, a silicon substrate. Moreover, the circuit portion is a functional unit having a function of switching the connection state between the corresponding common terminal and the corresponding selection terminals. In plan view in the thickness direction D1 of the mount board 9, the outer shape of each IC chip forming the corresponding one of the first switch 104, the second switch 105, and the third switch 106 is quadrate. For example, each of the first switch 104, the second switch 105, and the third switch 106 is flip-chip packaged on the first principal surface 91 of the mount board 9 so that, among the first principal surface and the second principal surface of the corresponding substrate, the first principal surface is present on the first principal surface 91 side of the mount board 9.

As illustrated in FIG. 3, the controller 107 and the on-off switch 108 are formed in the single chip 10. That is, the chip 10 includes the controller 107 and the on-off switch 108. The chip 10 is flip-chip packaged on the first principal surface 91 of the mount board 9. In plan view in the thickness direction D1 of the mount board 9, the chip 10 is, for example, quadrate.

The inductor in the output matching circuit 113 is, for example, a chip inductor. For example, the inductor in the output matching circuit 113 is disposed, but not limited to, on the first principal surface 91 side of the mount board 9. In plan view in the thickness direction D1 of the mount board 9, the outer shape of the inductor is quadrate.

The inductor in the input matching circuit 123 is, for example, a chip inductor. For example, the inductor in the input matching circuit 123 is disposed, but not limited to, on the first principal surface 91 side of the mount board 9. In plan view in the thickness direction D1 of the mount board 9, the outer shape of the inductor is quadrate.

The external connection terminals 80 are disposed on the second principal surface 92 of the mount board 9. Each of the external connection terminals 80 is a pillar-shaped (for example, columnar) terminal. Moreover, the material of the external connection terminals 80 is metal (for example, copper or a copper alloy).

The external connection terminals 80 include the ground terminals 86 in addition to the antenna terminal 81, the signal input terminal 82, the signal output terminal 83, the control terminal 84, and the connection terminal 85. As described above, the ground terminals 86 are electrically connected to the ground layer of the mount board 9. The ground layer is a circuit ground of the radio-frequency module 100.

As illustrated in FIGS. 2 and 3, in the radio-frequency module 100 according to the first embodiment, the first electronic component 1 and the second electronic component 2 are formed in the single chip 10. That is, in the radio-frequency module 100 according to the first embodiment, the controller 107 and the on-off switch 108 are formed in the single chip 10. Moreover, in the radio-frequency module 100, the controller 107 and the on-off switch 108 included in the chip 10 are disposed on the first principal surface 91 side of the mount board 9.

As described above, in the radio-frequency module 100 according to the first embodiment, the controller 107, which is included in chip 10 as shown in FIG. 3, is disposed on the first principal surface 91 side of the mount board 9, and the connection terminal 85 is disposed on the second principal surface 92 side of the mount board 9. As illustrated in FIG. 2, in plan view in the thickness direction D1 of the mount board 9, a portion of the chip 10 including the controller 107 overlies a portion of the connection terminal 85. Thus, compared with the case in which the controller 107 does not overlie the connection terminal 85, a design can be made in which the wiring length between the controller 107 and the connection terminal 85 is short.

(2) The Operation of the Radio-Frequency Circuit

The operation of the radio-frequency circuit 100 according to the first exemplary embodiment will be described.

As described above, in the radio-frequency circuit 100 according to the first embodiment, the controller 107 is configured to operate the power amplifier 111 in the first power mode or the second power mode. Moreover, the first power mode is the mode for controlling the power amplifier 111 by using the envelope tracking system, and the second power mode is the mode for controlling the power amplifier 111 by using the average power tracking system. Specifically, when the transmit power is high, the controller 107 operates the power amplifier 111 in the first power mode, and when the transmit power is low, the controller 107 operates the power amplifier 111 in the second power mode.

In the first power mode, the controller 107 controls the power supply voltage, which is input to the power supply terminal 1111 of the power amplifier 111, in accordance with the input signal level of a transmit signal received by the power amplifier 111. Specifically, for example, the controller 107 generates a power supply voltage on the basis of the power-supply control signal (e.g., the envelope signal) from the baseband signal processing circuit 303 of the signal processing circuit 301, and supplies the generated power supply voltage to the power supply terminal 1111 of the power amplifier 111.

In the envelope tracking operation, the voltage is controlled in a period shorter than that in the average power tracking operation. Therefore, when the capacitive element 320 is connected to the path R2 in the envelope tracking operation, the envelope tracking operation fails to be performed. Therefore, in the first power mode in which the power amplifier 111 is made to perform the envelope tracking operation, the controller 107 switches off the on-off switch 108 to detach the capacitive element 320 from the path R2.

As described above, in the second power mode, the controller 107 controls the power supply voltage, which is input to the power supply terminal 1111 of the power amplifier 111, in accordance with the average power amplitude. Specifically, for example, the controller 107 is configured to calculate the average power amplitude of a radio-frequency signal for each predetermined period on the basis of the power-supply control signal from the baseband signal processing circuit 303, and to supply a power supply voltage, which is generated in accordance with the calculated average power amplitude, to the power supply terminal 1111 of the power amplifier 111.

In the second power mode, the parasitic inductor component of the path R2 is large, and the power supply voltage supplied to the power supply terminal 1111 of the power amplifier 111 from the controller 107 is unstable. Therefore, the controller 107 switches on the on-off switch 108, and connects the capacitive element 320 to the path R2. Thus, the parasitic inductor component of the path R2 may be reduced. As a result, the power supply voltage supplied to the power supply terminal 1111 of the power amplifier 111 may be stabilized in the second power mode.

(3) Conclusion (3.1) The Radio-Frequency Circuit

The radio-frequency circuit 100 according to the first embodiment includes the power amplifier 111, the controller 107, the on-off switch 108, the connection terminal 85, and the mount board 9. Moreover, the power amplifier 111, which has the power supply terminal 1111, is configured for supporting the average power tracking system and the envelope tracking system. The controller 107, which is connected to the power supply terminal 1111, controls the power amplifier 111 by using the average power tracking system and the envelope tracking system. The on-off switch 108 is connected in series to the capacitive element 320 connected between the ground and the path R2 between the controller 107 and the power supply terminal 1111. The connection terminal 85 is connected to the capacitive element 320. The mount board 9 has the first principal surface 91 and the second principal surface 92 which are opposite each other. In plan view in the thickness direction D1 of the mount board 9, the control circuit 107 overlies the connection terminal 85.

In the radio-frequency circuit 100 according to the first embodiment, the capacitive element 320 is connected to the path R2 by switching on the on-off switch 108 in the average power tracking system. This enables the parasitic inductor component of the path R2 to be reduced. Thus, the power supply voltage to the power supply terminal 1111 of the power amplifier 111 is stabilized in the average power tracking system.

In the radio-frequency circuit 100 according to the first embodiment, the controller 107 overlies the connection terminal 85 in plan view in the thickness direction D1 of the mount board 9. Thus, compared with the case in which the controller 107 does not overlie the connection terminal 85, a design can be made in which the wiring length between the controller 107 and the connection terminal 85 is short.

In the radio-frequency circuit 100 according to the first embodiment, the controller 107 and the on-off switch 108 are formed in the single chip 10. Thus, compared with the case in which the controller 107 and the on-off switch 108 are formed in different chips, the area of the mount board 9 can be made small in plan view in the thickness direction D1 of the mount board 9.

(3.2) The Communication Device

The communication device 300 according to the first exemplary embodiment includes the radio-frequency circuit 100 and the signal processing circuit 301. The signal processing circuit 301, which is connected to the radio-frequency circuit 100, processes radio-frequency signals.

The communication device 300 according to the first embodiment includes the radio-frequency circuit 100. Thus, the power supply voltage to the power supply terminal 1111 of the power amplifier 111 may be stabilized in the average power tracking system.

(4) Modifications

Modifications of the first exemplary embodiment will be listed below. The modifications described below may be appropriately combined for application.

(4.1) First Modification

A radio-frequency circuit 100a according to a first modification of the first embodiment will be described by referring to FIG. 4. Components, which are substantially the same as those of the radio-frequency circuit 100 according to the first embodiment, of the radio-frequency circuit 100a according to the first modification are designated with the same reference numerals, and will not be described.

The radio-frequency circuit 100a according to the first modification is different from the radio-frequency circuit 100 according to the first embodiment in that, on the first principal surface 91 of the mount board 9, the chip 10, which includes the first electronic component 1 and the second electronic component 2, is laminated on a fourth electronic component 4.

Figure 4:
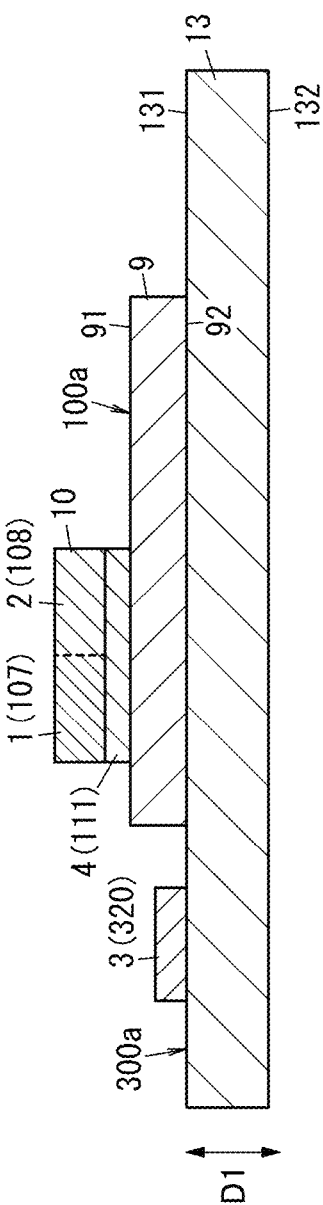
FIG. 4 is a cross-sectional view of a radio-frequency circuit according to a first modification of the first exemplary embodiment.

As illustrated in FIG. 4, in the radio-frequency circuit 100a, the fourth electronic component 4 is flip-chip packaged on the first principal surface 91 of the mount board 9. The fourth electronic component 4 is, for example, the power amplifier 111. In the radio-frequency circuit 100a, the chip 10, which includes the first electronic component 1 and the second electronic component 2, is flip-chip packaged on the principal surface, which is on the opposite side to the mount board 9, of the fourth electronic component 4. That is, in the radio-frequency circuit 100a according to the first modification, on the first principal surface 91 of the mount board 9, the fourth electronic component 4 and the chip 10 (the first electronic component 1 and the second electronic component 2) are laminated in this sequence from the mount board 9 side. In short, the controller 107 and the on-off switch 108 are disposed on the opposite side of the power amplifier 111 to the mount board 9.

In the radio-frequency circuit 100a according to the first modified example, as described above, the first electronic component 1 and the second electronic component 2, which are included in the chip 10, and the fourth electronic component 4 are laminated on the first principal surface 91 of the mount board 9. Thus, compared with the case in which the chip 10 and the fourth electronic component 4 are disposed separately on the first principal surface 91 of the mount board 9, the area of the mount board 9 can be made small in the plan view in the thickness direction D1 of the mount board 9.

In the radio-frequency circuit 100a according to the first modification, the chip 10, which includes the first electronic component 1 and the second electronic component 2, overlies the fourth electronic component 4 in the thickness direction D1 of the mount board 9. Thus, compared with the case in which the chip 10 and the fourth electronic component 4 are disposed separately on the first principal surface 91 of the mount board 9, the wiring length between the first electronic component 1 and the fourth electronic component 4 can be made short, and the wiring length between the second electronic component 2 and the fourth electronic component 4 can also be made short.

(4.2) Second Modification

A radio-frequency circuit 100b according to a second modification of the first exemplary embodiment will be described by referring to FIG. 5. Components, which are substantially the same as those of the radio-frequency circuit 100a according to the first modification, of the radio-frequency circuit 100b according to the second modification are designated with the same reference numerals, and will not be described.

The radio-frequency circuit 100b is different from the radio-frequency circuit 100a in that the chip 10, which includes the first electronic component 1 and the second electronic component 2, is disposed on the second principal surface 92 side of the mount board 9.

Figure 5:
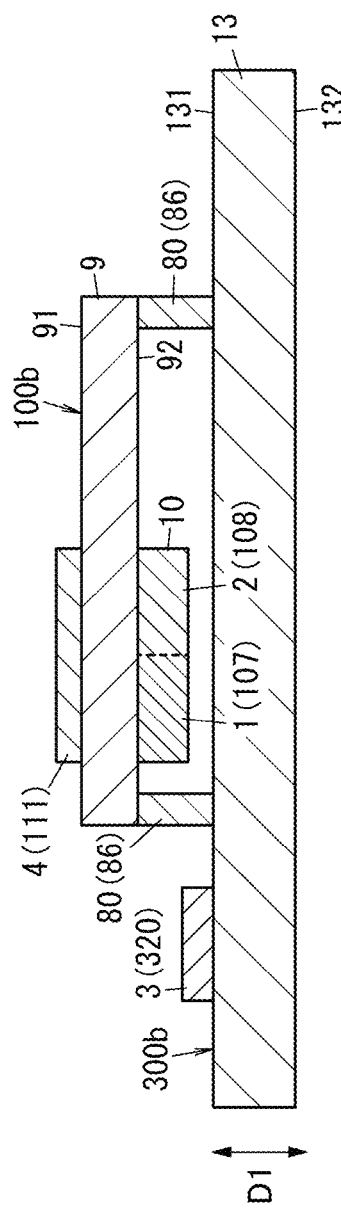
FIG. 5 is a cross-sectional view of a radio-frequency circuit according to a second modification of the first exemplary embodiment.

In the radio-frequency circuit 100b according to the second modification, as illustrated in FIG. 5, the fourth electronic component 4 is flip-chip packaged on the first principal surface 91 of the mount board 9. In the radio-frequency circuit 100b, the chip 10, which includes the first electronic component 1 and the second electronic component 2, is flip-chip packaged on the second principal surface 92 of the mount board 9. That is, in the radio-frequency circuit 100b, the power amplifier 111 (the fourth electronic component 4) is disposed on the first principal surface 91 side of the mount board 9, and the controller 107 and the on-off switch 108 (the first electronic component 1 and the second electronic component 2) are disposed on the second principal surface 92 side of the mount board 9.

In the radio-frequency circuit 100b according to the second modification, as described above, the fourth electronic component 4 is disposed on the first principal surface 91 side of the mount board 9, and the first electronic component 1 and the second electronic component 2, which are included in the chip 10, are disposed on the second principal surface 92 of the mount board 9. Thus, compared with the case in which the chip 10 and the fourth electronic component 4 are disposed on the first principal surface 91 side of the mount board 9, the area of the mount board 9 can be made small in plan view in the thickness direction D1 of the mount board 9.

In the radio-frequency circuit 100b according to the second modification, the fourth electronic component 4 overlies the chip 10, which includes the first electronic component 1 and the second electronic component 2, in plan view in the thickness direction D1 of the mount board 9. Thus, compared with the case in which the fourth electronic component 4 does not overlie the chip 10 in plan view in the thickness direction D1 of the mount board 9, the wiring length between the first electronic component 1 and the fourth electronic component 4 can be made short, and the wiring length between the second electronic component 2 and the fourth electronic component 4 can also be made short.

(4.3) Third Modification

A radio-frequency circuit 100c according to a third modification of the first exemplary embodiment will be described by referring to FIG. 6. Components, which are substantially the same as those of the radio-frequency circuit 100 according to the first embodiment, of the radio-frequency circuit 100c according to the third modification are designated with the same reference numerals, and will not be described.

The radio-frequency circuit 100c according to the third modification is different from the radio-frequency circuit 100 according to the first embodiment in that, in addition to the first electronic component 1 and the second electronic component 2, a fifth electronic component 5 is included in a chip 10c.

Figure 6:
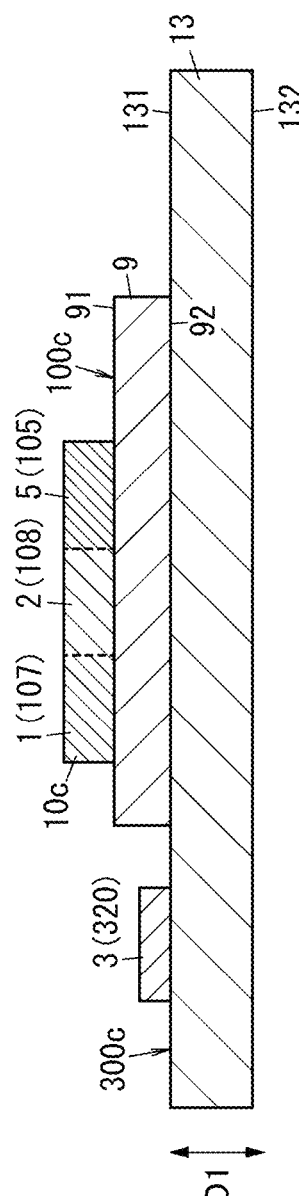
FIG. 6 is a cross-sectional view of a radio-frequency circuit according to a third modification of the first exemplary embodiment.

As illustrated in FIG. 6, in the radio-frequency circuit 100c according to the third modification, the first electronic component 1, the second electronic component 2, and the fifth electronic component 5 are formed in the single chip 10c. That is, the chip 10c includes the first electronic component 1, the second electronic component 2, and the fifth electronic component 5. The fifth electronic component 5 is, for example, the second switch 105. That is, in the radio-frequency circuit 100c, the controller 107, the on-off switch 108, and the second switch 105 are formed in the single chip 10c. As illustrated in FIG. 6, the chip 10c is disposed on the first principal surface 91 side of the mount board 9.

In the radio-frequency circuit 100c according to the third modification, as described above, the first electronic component 1, the second electronic component 2, and the fifth electronic component 5, which are formed in the single chip 10c, are disposed on the first principal surface 91 side of the mount board 9. Thus, compared with the case in which at least two of the components, that is, the first electronic component 1, the second electronic component 2, and the fifth electronic component 5, are disposed separately on the first principal surface 91 side, the area of the mount board 9 can be made small in the thickness direction D1 of the mount board 9.

(4.4) Other Modifications

In the radio-frequency circuit 100 according to the first embodiment, at least the controller 107 and the on-off switch 108 are formed in the single chip 10 or 10c. For example, the controller 107 and the on-off switch 108 may be formed in different chips.

Moreover, in the radio-frequency circuit 100 according to the first embodiment, the on-off switch 108 and the capacitive element 320 are connected so that, between the ground and the path R2 between the controller 107 and the power supply terminal 1111 of the power amplifier 111, the on-off switch 108 is present on the opposite side to the ground, and the capacitive element 320 is present on the ground side. However, the configuration is not limited to this. That is, the on-off switch 108 and the capacitive element 320 may be connected so that, between the path R2 and the ground, the on-off switch 108 is present on the ground side and the capacitive element 320 is present on the opposite side to the ground.

As illustrated in FIG. 2, in the radio-frequency circuit 100 according to the first embodiment, a portion of the controller (e.g., the control circuit) 107, which is included in chip 10 as shown in FIG. 3, overlies the connection terminal 85 in position in plan view in the thickness direction D1 of the mount board 9. However, the configuration is not limited to this. For example, the entire controller 107 may overlie the entire connection terminal 85 in plan view in the thickness direction D1 of the mount board 9. Alternatively, the entire controller 107 may overlie a portion of the connection terminal 85. Alternatively, a portion of the controller 107 may overlie the entire connection terminal 85. In short, the phrase "the controller overlies the connection terminal in plan view in the thickness direction of the mount board" refers to the state in which at least a portion of the controller overlies at least a portion of the connection terminal in plan view in the thickness direction of the mount board.

Second Exemplary Embodiment

Figure 7:
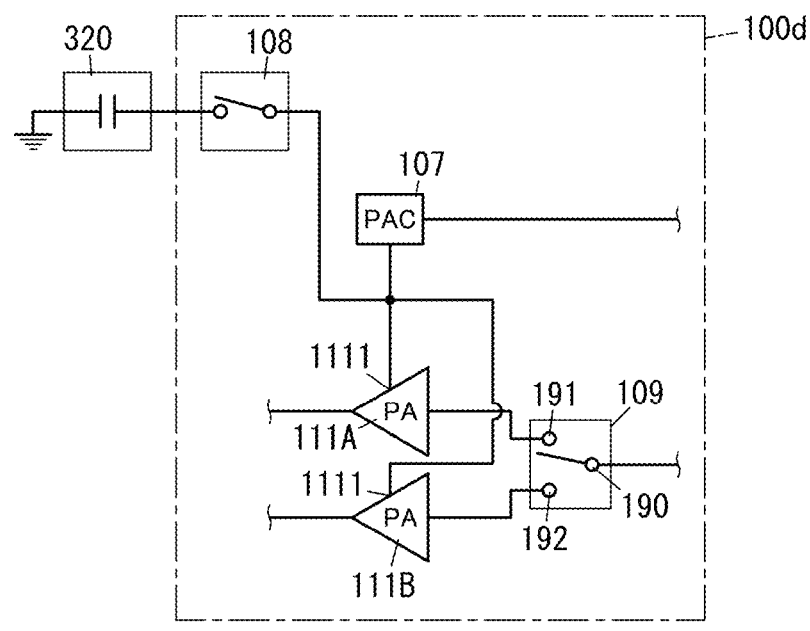
FIG. 7 is a diagram illustrating the circuit configuration of a principal part of a radio-frequency circuit according to a second exemplary embodiment.

A radio-frequency circuit 100d according to the second exemplary embodiment will be described by referring to FIGS. 7 and 8. Components, which are substantially the same as those of the radio-frequency circuit 100 according to the first embodiment, of the radio-frequency circuit 100d according to the second embodiment are designated with the same reference numerals, and will not be described.

The radio-frequency circuit 100d according to the second embodiment is different from the radio-frequency circuit 100 according to the first embodiment in that, instead of the second switch 105 on the output side of the power amplifier 111, a fourth switch (e.g., a selector switch) 109 is disposed on the input side of multiple (in the illustrated example, two) power amplifiers 111A and 111B.

The Circuit Configuration of the Radio-Frequency Circuit

The circuit configuration of the radio-frequency circuit 100d according to the first embodiment will be described by referring to FIG. 7.

The radio-frequency circuit 100d according to the second embodiment includes the multiple (e.g., two) power amplifiers 111A and 111B and the low-noise amplifier 121 (see FIG. 1). The radio-frequency circuit 100d also includes the multiple (e.g., two) transmit filters 112A and 112B (see FIG. 1) and the multiple (e.g., two) receive filters 122A and 122B (see FIG. 1). The radio-frequency circuit 100d also includes the output matching circuit 113 (see FIG. 1), the input matching circuit 123 (see FIG. 1), and the multiple (in the illustrated example, two) matching circuits 114 and 124 (see FIG. 1). The radio-frequency circuit 100d also includes the first switch 104 (see FIG. 1), the third switch 106 (see FIG. 1), and the fourth switch (e.g., a selector switch) 109. The radio-frequency circuit 100d also includes the controller (e.g., a control circuit) 107 and the on-off switch 108. The radio-frequency circuit 100d also includes the external connection terminals 80 (see FIG. 1).

Each of the power amplifiers 111A and 111B has an input terminal, an output terminal, and a power supply terminal 1111. The power amplifier 111A amplifies transmit signals in the first communication band, which are received at the input terminal, for output to the output terminal. The power amplifier 111B amplifies transmit signals in the second communication band, which are received at the input terminal, for output from the output terminal.

The power amplifier 111A is connected, at the input terminal, to a selection terminal 191 of the fourth switch 109. The power amplifier 111A is connected, at the output terminal, to the transmit filter 112A. The power amplifier 111B is connected, at the input terminal, to a selection terminal 192 of the fourth switch 109. Moreover, the power amplifier 111B is connected, at the output terminal, to the transmit filter 112B. Each of the power amplifiers 111A and 111B is connected, at its power supply terminal 1111, to the controller 107. Each of the power amplifiers 111A and 111B is controlled, for example, by the controller 107.

The fourth switch 109 has a common terminal 190 and the multiple (e.g., two) selection terminals 191 and 192. The common terminal 190 is connected to the signal input terminal 82. The selection terminal 191 is connected to the input terminal of the power amplifier 111A. The selection terminal 192 is connected to the input terminal of the power amplifier 111B. The fourth switch 109 is, for example, a switch that is configured to connect at least one of the selection terminals 191 and 192 to the common terminal 190. The fourth switch 109 is, for example, a switch that configures a one-to-one connection and a one-to-many connection. The fourth switch 109 is a switch which has a function of switching between the signal paths T11 and T12, for transmit signals, whose communication bands are different from each other.

The fourth switch 109 is controlled, for example, by the controller 107. The fourth switch 109 switches the connection state between the common terminal 190 and the selection terminals 191 and 192 in accordance with a control signal from the controller 107.

(2) The Structure of the Radio-Frequency Module

Figure 8:
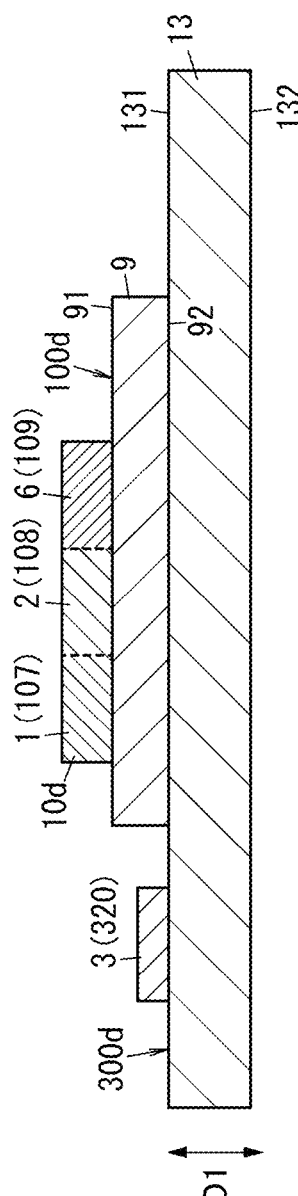
FIG. 8 is a cross-sectional view of the radio-frequency circuit.

As illustrated in FIG. 8, the radio-frequency circuit 100d according to the second embodiment includes the mount board 9. Hereinafter, the radio-frequency circuit 100d including the mount board 9 may be referred to as the "radio-frequency module 100d" for purposes of this disclosure. The structure of the radio-frequency module 100d according to the second embodiment will be described by referring to FIG. 8.

As illustrated in FIG. 8, the radio-frequency module 100d according to the second embodiment includes the mount board 9, the first electronic component 1, the second electronic component 2, a sixth electronic component 6, and the external connection terminals 80 (see FIG. 1). The first electronic component 1 is, for example, the controller 107. The second electronic component 2 is, for example, the on-off switch 108. The sixth electronic component 6 is, for example, the fourth switch 109. In the radio-frequency module 100d according to the second embodiment, the controller 107, the on-off switch 108, and the fourth switch 109 are formed in a single chip 10d. That is, the chip 10d includes the controller 107, the switch 108, and the fourth switch 109. The chip 10d is disposed on the first principal surface 91 side of the mount board 9.

In the radio-frequency module 100d according to the second embodiment, the first electronic component 1, the second electronic component 2, and the sixth electronic component 6 are formed in the single chip 10d. Thus, compared with the case in which at least two of the components, that is, the first electronic component 1, the second electronic component 2, and the sixth electronic component 6, are formed in different chips, it is possible to make the area of the mount board 9 small in plan view in the thickness direction D1 of the mount board 9.

In the radio-frequency module 100d according to the second embodiment, in plan view in the thickness direction D1 of the mount board 9, a portion of the control circuit 107 included in the chip 10d overlies a portion of the connection terminal 85, which is not illustrated. Thus, it is possible to make a design in which the wiring length between the control circuit 107 and the connection terminal 85 is short.

Exemplary Aspects

The following aspects are disclosed in the specification.

A radio-frequency circuit (100; 100a to 100d) according to a first exemplary aspect includes a power amplifier (111; 111A, 111B), a control circuit (107), an on-off switch (108), a connection terminal (85), and a mount board (9). The power amplifier (111; 111A, 111B), which has a power supply terminal (1111), is configured for supporting the average power tracking system and the envelope tracking system. The control circuit (107), which is connected to the power supply terminal (1111), controls the power amplifier (111; 111A, 111B) by using the average power tracking system and the envelope tracking system. The on-off switch (108) is connected in series to a capacitive element (320) connected between the ground and the path (R2) between the control circuit (107) and the power supply terminal (1111). The connection terminal (85) is connected to the capacitive element (320). The mount board (9) has a first principal surface (91) and a second principal surface (92) that are opposite each other. Moreover, the control circuit (107) overlies the connection terminal (85) in plan view in the thickness direction (D1) of the mount board (9).

According to the exemplary aspect, the capacitive element (320) is connected to the path (R2) by switching on the on-off switch (108) in the average power tracking system. This configuration enables the parasitic inductor component of the path (R2) to be reduced. Thus, the power supply voltage to the power supply terminal (1111) is stabilized in the average power tracking system. In addition, according to the aspect, a design can be made in which the wiring length between the control circuit (107) and the connection terminal (85) is short.

According to a second exemplary aspect, in the radio-frequency circuit (100; 100a to 100d) according to the first aspect, the on-off switch (108) is connected between the path (R2) and the capacitive element (320).

According to the exemplary aspect, the capacitive element (320) is connected to the path (R2) by switching on the on-off switch (108) in the average power tracking system. This configuration enables the parasitic inductor component of the path (R2) to be reduced. Thus, the power supply voltage to the power supply terminal (1111) is stabilized in the average power tracking system.

According to a third exemplary aspect, in the radio-frequency circuit (100; 100a to 100d) according to the first or second aspect, when the control circuit (107) controls the power amplifier (111; 111A, 111B) by using the average power tracking system, the control circuit (107) switches on the on-off switch (108). When the control circuit (107) controls the power amplifier (111; 111A, 111B) by using the envelope tracking system, the control circuit (107) switches off the on-off switch (108).

According to the exemplary aspect, the capacitive element (320) is connected to the path (R2) by switching on the on-off switch (108) in the average power tracking system. This enables the parasitic inductor component of the path (R2) to be reduced. Thus, the power supply voltage to the power supply terminal (1111) is stabilized in the average power tracking system.

According to a fourth exemplary aspect, in the radio-frequency circuit (100a) according to any one of the first to third aspects, the power amplifier (111) is disposed on the first principal surface (91) side. The control circuit (107) and the on-off switch (108) are disposed on the opposite side of the mount board (9) to the power amplifier (111).

According to the exemplary aspect, compared with the case in which the power amplifier (111), and the control circuit (107) and the on-off switch (108) are disposed separately on the first principal surface (91) side, the area of the mount board (9) can be made small in plan view in the thickness direction (D1) of the mount board (9).

According to a fifth exemplary aspect, in the radio-frequency circuit (100) according to any one of the first to third aspects, the control circuit (107) and the on-off switch (108) are disposed on the first principal surface (91) side.

According to a sixth exemplary aspect, in the radio-frequency circuit (100; 100a; 100b) according to any one of the first to fifth aspects, the control circuit (107) and the on-off switch (108) are formed in a single chip (10).

According to the exemplary aspect, compared with the case in which the control circuit (107) and the on-off switch (108) are formed in different chips, the area of the mount board (9) can be made small in plan view in the thickness direction (D1) of the mount board (9).

According to a seventh exemplary aspect, the radio-frequency circuit (100d) according to any one of the first to fifth aspects further includes a selector switch (109). The selector switch (109) is connected between the power amplifier (111A, 111B) and multiple transmit filters (112A, 112B) having passbands different from each other. The control circuit (107), the on-off switch (108), and the selector switch (109) are formed in a single chip (10d).

According to the exemplary aspect, compared with the case in which at least two of the components, that is, the control circuit (107), the on-off switch (108), and the selector switch (109), are formed in different chips, the area of the mount board (9) can be made small in plan view in the thickness direction (D1) of the mount board (9).

A communication device (300; 300d) according to an eighth exemplary aspect includes the radio-frequency circuit (100; 100a to 100d) according to any one of the first to seventh aspects, and a signal processing circuit (301). The signal processing circuit (301), which is connected to the radio-frequency circuit (100; 100a to 100d), processes a radio-frequency signal.

According to the exemplary aspect, the capacitive element (320) is connected to the path (R2) by switching on the on-off switch (108) in the average power tracking system. This configuration enables the parasitic inductor component of the path (R2) to be reduced. Thus, the power supply voltage to the power supply terminal (1111) is stabilized in the average power tracking system. In addition, according to the aspect, a design is provided in which the wiring length between the control circuit (107) and the connection terminal (85) is short.

REFERENCE SIGNS LIST 1 first electronic component
2 second electronic component
3 third electronic component
4 fourth electronic component
5 fifth electronic component
6 sixth electronic component
9 mount board
10, 10d chip
13 circuit board
80 external connection terminal
81 antenna terminal
82 signal input terminal
83 signal output terminal
84 control terminal
85 connection terminal
86 ground terminal
91 first principal surface
92 second principal surface
100, 100a to 100d radio-frequency circuit
104 first switch
105 second switch
106 third switch
107 controller (control circuit)
108 on-off switch
109 fourth switch (selector switch)
111, 111A, 111B power amplifier
112A, 112B transmit filter
114 matching circuit
121 low-noise amplifier
122A, 122B receive filter
124 matching circuit
131 first principal surface
132 second principal surface
140 common terminal
141, 142 selection terminal
150 common terminal
151, 152 selection terminal
160 common terminal
161, 162 selection terminal
190 common terminal
191, 192 selection terminal
300, 300a to 300d communication device
301 signal processing circuit
302 RF signal processing circuit
303 baseband signal processing circuit
310 antenna
320 capacitive element
1111 power supply terminal
D1 thickness direction
R1, R11, R12 signal path
R2 path
T1, T11, T12 signal path

The invention claimed is:

1. A radio-frequency circuit comprising:
a power amplifier that has a power supply terminal, and that is configured to support an average power tracking system and an envelope tracking system;
a control circuit that is connected to the power supply terminal, and that is configured to control the power amplifier by using the average power tracking system and the envelope tracking system;
an on-off switch that is connected in series to a capacitive element connected between a ground and a path between the control circuit and the power supply terminal;
a connection terminal that is connected to the capacitive element; and
a mount board that has first and second principal surfaces that oppose each other,
wherein the control circuit is disposed on the first principal surface of the mount board and the connection terminal is disposed on the second principal surface of the mount board, such that the control circuit overlies the connection terminal in a plan view in a thickness direction of the mount board, and
wherein the capacitive element does not overlie the control circuit in the thickness direction of the mount board.

2. The radio-frequency circuit according to claim 1, wherein the on-off switch is connected between the path and the capacitive element.

3. The radio-frequency circuit according to claim 1, wherein, when the control circuit controls the power amplifier by using the average power tracking system, the control circuit switches on the on-off switch.

4. The radio-frequency circuit according to claim 3, wherein, when the control circuit controls the power amplifier by using the envelope tracking system, the control circuit switches off the on-off switch.

5. The radio-frequency circuit according to claim 1, wherein the power amplifier is disposed on the first principal surface of the mount board.

6. The radio-frequency circuit according to claim 1, wherein the on-off switch is disposed on the first principal surface of the mount board.

7. The radio-frequency circuit according to claim 1, wherein the control circuit and the on-off switch are formed in a single chip.

8. The radio-frequency circuit according to claim 1, further comprising a selector switch that is connected between the power amplifier and a plurality of transmit filters having passbands different from each other.

9. The radio-frequency circuit according to claim 8, wherein the control circuit, the on-off switch, and the selector switch are formed in a single chip.

10. The radio-frequency circuit according to claim 1, wherein the connection terminal is connected between the capacitive element and the path between the control circuit and the power supply terminal.

11. The radio-frequency circuit according to claim 1, further comprising an additional electronic component disposed between the first principal surface of the mount board and the control circuit, and wherein the control circuit and the capacitive element are separate modules components disposed adjacent to each other on the first principal surface of the mount board and are directly connected to each other.

12. The radio-frequency circuit according to claim 11, wherein the additional electronic component is a flip-chip package that includes the power amplifier.

13. A communication device comprising:
the radio-frequency circuit according to claim 1; and
a signal processing circuit that is connected to the radio-frequency circuit and that processes a radio-frequency signal.

14. A radio-frequency circuit comprising:
a power amplifier having a power supply terminal;
a control circuit that is connected to the power supply terminal of the power amplifier;

an on-off switch that is connected in series to a capacitive element connected between a ground and a path between the control circuit and the power supply terminal;
a connection terminal that is connected to the capacitive element; and
a mount board that has first and second principal surfaces that oppose each other,
wherein the control circuit is disposed on the first principal surface of the mount board and the connection terminal is disposed on the second principal surface of the mount board, such that the control circuit overlies the connection terminal in a plan view of the mount board, and
wherein the capacitive element does not overlie the control circuit in the thickness direction of the mount board.

15. The radio-frequency circuit according to claim 14, wherein the on-off switch is connected between the path and the capacitive element.

16. The radio-frequency circuit according to claim 14,
wherein, when the control circuit controls the power amplifier by using an average power tracking system, the control circuit switches on the on-off switch, and
wherein, when the control circuit controls the power amplifier by using an envelope tracking system, the control circuit switches off the on-off switch.

17. The radio-frequency circuit according to claim 14, wherein the power amplifier is disposed on the first principal surface of the mount board.

18. The radio-frequency circuit according to claim 14, wherein the on-off switch is disposed on the first principal surface of the mount board.

* * * * *